Aug. 14, 1962 H. P. TAYLOR 3,049,631

FREQUENCY DIODE-RATE COUNTER CIRCUITS

Filed Oct. 24, 1958

INVENTOR
HUGH P. TAYLOR
BY H. Vincent Harsha
ATTORNEY

United States Patent Office 3,049,631

Patented Aug. 14, 1962

3,049,631
FREQUENCY DIODE-RATE COUNTER CIRCUITS

Hugh P. Taylor, Littleton, Mass., assignor to Raytheon Company, a corporation of Delaware Filed Oct. 24, 1958, Ser. No. 769,368
8 Claims. (Cl. 307—88.5)

This invention relates to frequency measurement and control and more particularly to frequency rate counter circuits having improved stability and a high degree of linearity.

The circuit embodied in this invention finds particular utility in applications where a linear frequency vs. voltage characteristic is desired or where a linear frequency to voltage conversion characteristic is desired. Such characteristics are useful in the design of digital voltmeters, linear F.M. sources, variable linear oscillators, Doppler radar systems, computers and the like. Basic counter circuits and feedback circuits are principally concerned with linearity and/or stability. For example, prior art rate counter circuits, while having a more or less linear characteristic, are not satisfactory for many purposes requiring a high degree of linearity. Further, prior art rate counter circuits require a substantial amount of power for their operation and have a characteristic that does not go to zero. These defects are overcome by the invention.

A rate counter circuit, according to the invention, having improved stability and improved linearity of as low as .01 percent of its maximum operating range, is characterized in that a silicon zener reference diode or diodes is used for finally limiting a partially limited varying signal to produce an asymmetrical waveform to drive the counter. A portion of this signal is rectified and used to supply a selectable D.C. reference control voltage to determine a reference frequency zero output voltage for the counter. Three silicon switching diodes are biased in a new and novel manner to take advantage of the surface potential characteristic of such diodes to provide, inter alia, more linear counter operation. A first diode is arranged and adapted to be biased so that with a zero input signal it is biased at a point slightly above the knee of its current-voltage characteristic, i.e., it presents at all times a low impedance to an input signal to prevent drop-off of the slope characteristic of the counter that otherwise occurs with high frequency inputs in prior art counters. Two secondary switching diodes in combination with a capacitor connected to ground are connected such that the secondary diodes are normally biased below the knee of their voltage-current characteristics and present at all times a high impedance looking from the capacitor toward the first diode. If the first diode is, for example, at the knee of its voltage-current characteristic, the secondary diodes will have the voltage developed across the first diode divided equally across them and hence they will be biased below the knee of their voltage-current characteristics. This novel arrangement in a counter circuit reduces back leakage current, reduces zero offset errors and provides maximum sensitivity for the counter. It is therefore a principal object of this invention to provide a frequency-rate counter circuit having improved linearity and stability.

It is another object of this invention to provide a frequency to voltage conversion circuit.

It is a further object of this invention to provide a circuit having a linear frequency vs. voltage output signal.

It is a still further object of this invention to provide a circuit having increased stability and linearity for use as a feedback circuit in oscillator networks and the like to improve stability and dial calibration.

It order that the invention may be more fully understood, a preferred embodiment and two applications thereof will now be described with reference to the accompanying drawing, in which.

Figures 1, 2, 3, 4:
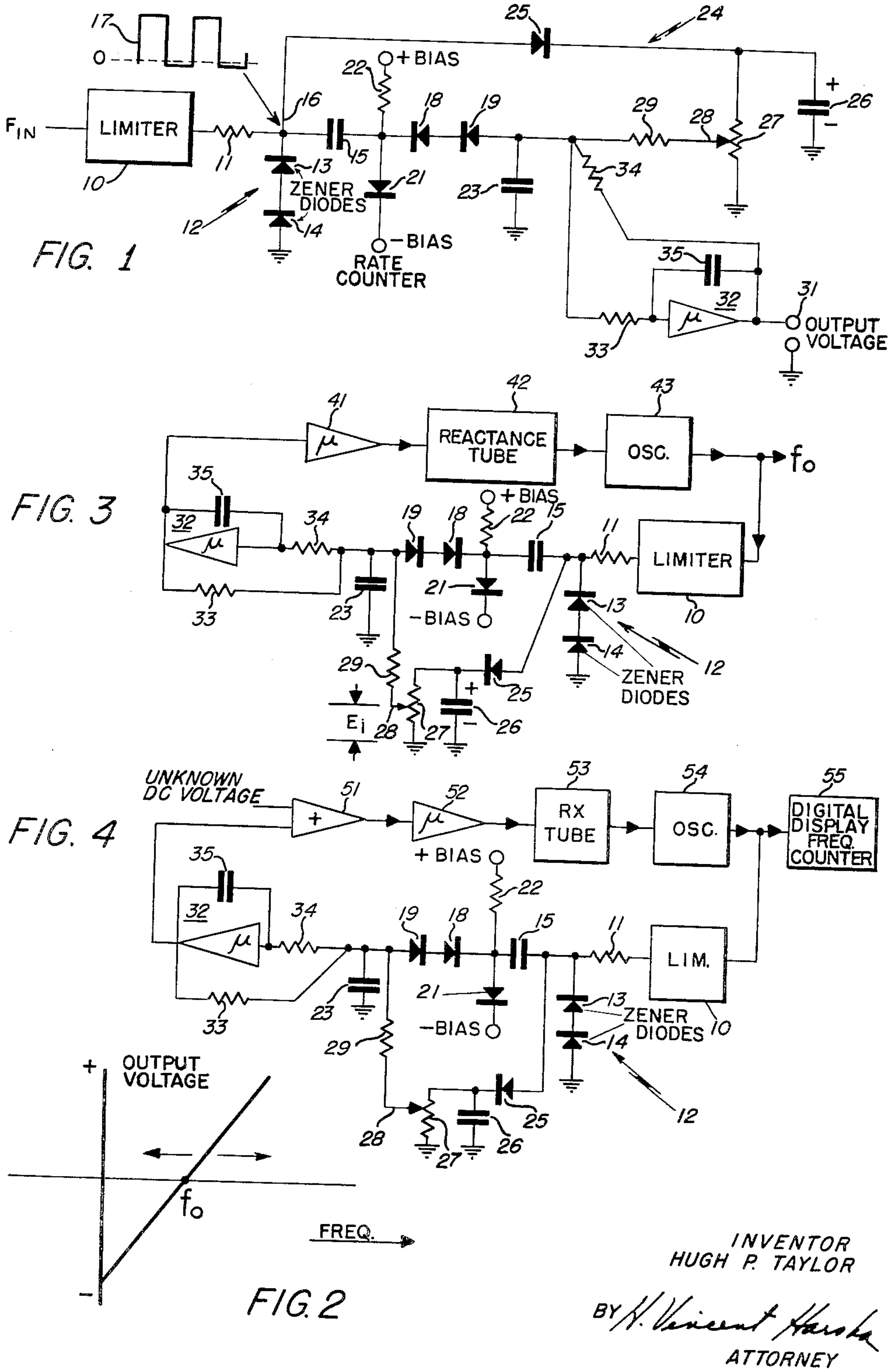
FIG. 1 is a schematic diagram of the improved frequency diode-rate counter circuit according to the invention.
FIG. 2 is a graphic representation of the frequency-voltage characteristic of the invention.
FIG. 3 is a schematic diagram, partly in block form, of an application of the invention to oscillator circuits.
FIG. 4 is a schematic diagram, partly in block form, of an application of the invention to digital voltmeter circuits.

With reference now to FIG. 1, there is shown a conventional limiter, indicated generally by the numeral 10, for receiving an oscillatory signal $F_{in}$ having a variable frequency of, for example, 1 kc.–100 kc., for limiting the positive and negative amplitudes of the input signal $F_{in}$ to suitable constant positive and negative values. A resistor 11 connects the output terminals of the limiter 10 to a final asymmetrical limiter 12, the latter comprising two series-connected diodes 13—14 of the silicon zener types which are grounded. Due to the surface potential characteristics of silicon type zener diodes, there will be obtained at point 16 and presented to capacitor 15 an asymmetrical signal having a waveform substantially as shown at 17 in FIG. 1 with a predetermined positive amplitude of, for example, sixteen volts, determined by the characteristic of the diode or diodes used and a negative amplitude of only about one volt. Substantially any desired positive amplitude of the asymmetrical signal may be provided by merely selecting one or more of the many silicon diodes available on the market, all of which have different voltage characteristics. The use of asymmetrical limiting contributes to a greater degree of stability by reason of the fact that use of an asymmetrical waveform to drive the counter provides a more stable feedback or reference control voltage at point 16 more thoroughly described hereinafter. Disposed between capacitor 15 and two series-connected silicon diodes 18—19 is another silicon diode 21 having a bias voltage applied across it from any suitable source (not shown) and a current limiting resistor 22 such that when $F_{in}$ is zero and hence a zero input signal condition is present, the biased diode 21 will be operating at a point just slightly above the knee of its current-voltage characteristic and thereby present a low impedance charge path to the capacitor 15. The use of a diode biased in the above manner provides a new and novel arrangement that allows a low impedance condition to be maintained in the charge path of capacitor 15 even when the charge current approaches zero. This arrangement provides a linear slope characteristic at high frequencies (see FIG. 2) and prevents a drop-off in the counter slope characteristic that occurs in prior art counter circuits at high frequency inputs due to an increasing charge time constant as the capacitor charge current approaches zero. The presence of this undesirable drop-off in prior art counter circuits is due to the inability of such prior art circuits to continuously provide a suitable low impedance condition or charge path as and for the purposes described hereinabove. A capacitor 23 is connected between diode 19 and ground. The use of series-connected silicon diodes 18—19 in the charge transferral path from substantially diode 21 to capacitor 23 results in each diode 18—19 being biased below the knee of its respective voltage-current characteristic and thus maintains a high impedance condition in the proper direction for a zero input signal condition. For example, if the biased diode 21 is biased at or just slightly above the knee of its voltage-current characteristic, series-connected diodes 18—19 will have present across each of them about one-half the voltage that is present across the biased diode 21. This arrangement reduces back leakage current to capacitor 15, thereby reducing zero offset errors and allows the realization of maximum sensitivity for the counter not heretofore possible. Alternately, a single silicon diode may be used in place of the series-connected diodes 18—19 and a germanium diode may be substituted for the silicon diode 21. With such an arrangement the inherent difference in the knees of the two different types of diodes may be utilized to obtain the same effect.

A variable D.C. zero reference control voltage is provided by means of a parallel circuit 24 connected between capacitor 23 and the final limiting diode 13 comprising a rectifier 25 connected between the final limiting diode 13 and a capacitor 26 and a potentiometer 27 connected in parallel and to ground. The variable arm 28 of the potentiometer 27 is connected through a resistor 29 to capacitor 23. As pointed out hereinbefore, the D.C. zero reference control voltage produced by the parallel circuit 24 is affected only by the positive portion of the asymmetrically drive signal 17, hence it may now be obvious that a stable control voltage is provided since the final limiting zener diodes 13—14 provide a signal having very little or substantially no negative portion and a substantially unvarying positive portion having a constant amplitude. A D.C. output voltage proportional to the frequency of the input signal is provided at 31 by a D.C. integrating feedback amplifier 32 connected across capacitor 23. The feedback amplifier 32 may be a Miller integrator having an input resistor 33 connected between capacitor 23 and the amplifier, a resistor 34 connected between capacitor 23 and the output of the amplifier, and a capacitor 35 connected between the input and output terminals of the amplifier.

During operation, an input signal $F_{in}$ having, for example, a variable frequency and amplitude, is initially limited by the limiter 10 and then finally limited by the reference diodes 13—14 to provide asymmetrical limiting wherein the drive signal to the counter is substantially an asymmetrical square wave having a predetermined positive amplitude determined by the characteristics of the diode or diodes used and a very small negative amplitude. Due to the bias on diode 21, a low impedance condtion is maintained at all times in the charge path of capacitor 15, particularly when the charge current to capacitor 15 approaches zero. As pointed out hereinbefore, this new and novel arrangement prevents drop-off in the slope characteristic of the counter output voltage that occurs in prior art counter circuits at high frequency inputs due to an increasing charge time constant as the charge current to capacitor 15 approaches zero. Further, the parallel circuit 24 provides a heretofore unattainable substantially linear slope characteristic for negative output voltages and/or a zero output voltage.

The provision of silicon diodes 18—19 renders the counter circuit substantially insensitive to temperature changes and results in a high impedance looking through diodes 18—19 toward diode 21 which results from the division across diodes 18—19 of the voltage present on diode 21. The instantaneous voltage appearing across condenser 23 is substantially the same as and proportional to the drive signal to the counter and is isolated therefrom due to the biasing and presence of diodes 18—19 in the charge transferral circuit portion of the counter. The parallel circuit 24 provides a highly stable selectable D.C. current at capacitor 23 which may by proper adjustment of potentiometer arm 28 be chosen to provide a zero output voltage at the output 31 of the feedback amplifier 32 coincident with, for example, the center frequency of the input signal. Potentiometer 27 and capacitor 26 of the parallel circuit 24 are selected to provide a time constant that is large with respect to the time constant of the input signal.

The D.C. integrating feedback amplifier 32 provides an output voltage at point 31 having the characteristic as shown in FIG. 2 and additionally functions to provide a net zero charge on capacitor 23. The use of silicon zener diodes, a self-contained parallel circuit and the unique biasing of the diodes in the charge transferral circuit portion of the counter provides a frequency diode-rate counter circuit having a degree of stability and linearity not achievable by the prior art, a circuit that consumes a minimum of power and a circuit that is essentially independent of power supply variations and the like. Further, attention is directed to the fact that a zero output voltage reference frequency of the counter, i.e., zero output voltage for a predetermined frequency, can be accurately produced and controlled by the position of the potentiometer arm 28. It may now be apparent that the invention can, inter alia, be used as an audio frequency discriminator operating in the range of 1–100 kc. for control work.

It may now be apparent that the invention is essentially a frequency-to-D.C. voltage converter and counter in which the frequency of an input signal causing zero output voltage can be linearly varied by means of a simple potentiometer arrangement. Consequently, the invention can be used, for example, as a feed-back circuit in a reactance tube controlled oscillator circuit to provide improved stability and dial calibration accuracy (linearity) of the oscillator. With reference now to FIG. 3, which shows such an arrangement, there is shown a D.C. amplifier 41 for receiving the output voltage of a diode-rate counter circuit identical to that shown in FIG. 1. The D.C. amplifier 41 provides an output signal adapted to control a reactance tube controlled oscillator comprised of a reactance tube 42 and an oscillator 43 having an output signal $f_o$, a portion of which is supplied to the limiter 10 of a diode-rate counter circuit identical to that shown in FIG. 1 and described hereinabove. If the oscillator 43 has a constant amplitude, output limiter 10 may be omitted.

That improved linearity is provided may be seen from observation of the general feedback formula for the feedback transfer function of a negative feedback system. This transfer function is:

$$\text{Transfer function} = \frac{-A}{1+BA} = \frac{-1}{\frac{1}{A}+B}$$

where A is the open loop gain characteristic and B is the feedback transfer function. When A is made large such that $$\frac{1}{A}$$

is considerably less than B, the transfer function is given by the formula:

$$\text{Transfer function} \approx \frac{-1}{B}$$

If B is equivalent to the counter characteristic in volts per cycle, the characteristic of the oscillator will be determined by $$\frac{1}{B}$$

in cycles per volt, where the input voltage is considered as the D.C. voltage $E_1$ at the potentiometer arm 28 as shown in FIG. 3. This function is a linear function and if potentiometer 27 is a linear potentiometer, extremely accurate dial calibration can be obtained. Further, the stability of the oscillator will also be improved over the uncompensated case because of the excellent stability of the counter circuit as pointed out hereinbefore.

An oscillator constructed in accordance with FIG. 3 and including the invention as a feedback circuit will provide improved performance in both frequency stability and dial calibration over prior art oscillators.

Another new and novel arrangement in which the invention may be advantageously utilized is shown in FIG. 4, wherein the diode-rate counter circuit as shown in FIG. 1 in combination with a voltage comparator circuit, controls a reactance tube oscillator to provide, for example, a digital voltmeter utilizing a digital type frequency counter calibrated in terms of voltage as the output indicator. The output signal of the feedback amplifier 32 is combined in a conventional voltage comparator 51 with an unknown D.C. voltage which it is desired to measure. The output of the voltage comparator 51 is supplied to a D.C. amplifier 52, reactance tube 53 and an oscillator 54 in a manner identical with that shown and described in FIG. 3. The output signal of the oscillator 54 is supplied in part to the limiter 10 of the diode-rate counter feedback circuit and to a suitable digital display frequency counter 55 calibrated in terms of voltage. The voltage comparator circuit 51 compares the D.C. output voltage of the diode-rate counter circuit with the unknown input D.C. voltage and provides a control voltage for the oscillator 54 whereby the oscillator 54 will have a frequency output that is directly proportional to the unknown input D.C. voltage. Adjustment of the variable potentiometer arm 28 provides a means for calibration of the digital display frequency counter. By the use of a linear synchronous detector circuit (not shown) the D.C. voltmeter as shown in FIG. 4 may be easily modified to operate as an A.C. voltmeter. As compared to prior art digital voltmeters, a digital voltmeter circuit incorporating the invention provides a more dependable and simplified circuit for the substantially increased degree of accuracy obtained. It should also be noted that this embodiment may also be used as a linear frequency modulation source, as a programmer for instrumentation and calibration of Doppler radar systems or where a linear frequency vs. time sweep signal is desired. Further, in conjunction with suitable spectrum analyzers, or if used as an arbitrary function generator, it is possible to determine the frequency transform of any given time function such as, for example, as may be desired in computers.

While there has been described a simplified form of what is considered a preferred embodiment of the invention and several applications thereof, it will be obvious to those skilled in the art that various changes and modifications thereof may be made without departing from the invention, and it is intended, therefore, to include all such changes and modifications as fall within the spirit of the invention and the scope of the appended claims.

What is claimed is:

1. An electrical circuit comprising: circuit means operative from an oscillatory input signal for producing an asymmetrical output signal; capacitive means having an input terminal and an output terminal; said input terminal being connected to said circuit means for receiving said asymmetrical output signal; first semiconductor diode means connected to said output terminal to provide a low impedance charge path to said capacitive means; a capacitor having one terminal connected to ground; second semiconductor diode means connected between said first semiconductor diode means and the other terminal of said capacitor for presenting a high impedance from said capacitor to said first semiconductor diode; and second circuit means connected between said first circuit means and said other terminal of said capacitor for supplying a zero reference direct current from said first circuit means to said capacitor.

2. An electrical circuit comprising: first means operative from an oscillatory input signal for producing an asymmetrical signal; a semiconductor diode; capacitive means connected between said first means and said diode for receiving said asymmetrical signal, said diode being normally biased to provide a low impedance charge path to said capacitive means; charge transferral means connected to said capacitive means and said diode including unidirectional means and a capacitor for providing a first voltage proportional to said asymmetrical signal; means connected between said capacitor and said first means for supplying a current to said capacitor; and a feedback amplifier operative from said first voltage for producing an output signal proportional to the frequency of said oscillatory input signal.

3. An electrical circuit comprising: first means operative from an oscillatory input signal for producing an asymmetrical signal having a small negative portion; a semiconductor diode; capacitive means connected between said first means and said diode for receiving said asymmetrical signal, said diode being biased to provide a low impedance charge path to said capacitive means when said input signal is substantially zero; charge transferral means connected to said diode including unidirectional means and a capacitor for providing a first voltage proportional to the frequency of said asymmetrical signal; means connected between said capacitor and said first means for supplying a direct current to said capacitor; and a feedback amplifier operative from said first voltage for producing an output signal proportional to the frequency of said oscillatory input signal.

4. An electrical circuit comprising: first means operative from an oscillatory input signal for producing an asymmetrical signal having a small negative portion; a semiconductor diode; a capacitive means connected between said first means and said diode for receiving said asymmetrical signal, said diode being biased to provide a low impedance charge path to said capacitive means when said input signal is substantially zero; charge transferral means connected to said capacitive means and said diode including unidirectional means and a capacitor for providing a first voltage proportional to the frequency of said asymmetrical signal; means connected between said capacitor and said first means for supplying a selectable direct current to said capacitor; and amplifier means operative from said first voltage for producing an output signal proportional to the frequency of said oscillatory input signal, a portion of the said output signal being supplied to said capacitor to maintain a net zero charge on said capacitor.

5. An electrical circuit comprising: first means operative from an oscillatory input signal for producing an asymmetrical signal having a small negative portion; a semiconductor diode; capacitive means connected between said first means and said diode, said diode being biased above the knee of its current-voltage characteristic when said input signal is substantially zero for providing a low impedance charge path to said capacitive means; charge transferral means connected to the common connection between said capacitive means and said diode including a unidirectional diode and a first capacitor connected to ground for providing a first voltage proportional to the frequency of said asymmetrical signal; a parallel circuit connected between said first capacitor and said first means for supplying a selectable direct current to said first capacitor, said means comprising rectifying means in series with a second capacitor and a potentiometer connected in parallel and to ground, said potentiometer having a variable arm connected to said first capacitor; and a feedback amplifier operative from said first voltage for producing an output signal proportional to the frequency of said oscillatory input signal.

6. An electrical circuit comprising: first means operative from an oscillatory input signal for producing an asymmetrical signal having a small negative portion; a first semiconductor diode; capacitive means connected between said first means and said first diode, said first diode being biased above the knee of its current-voltage characteristic when said input signal is substantially zero for providing a low impedance charge path to said capacitive means; charge transferral means including a first capacitor connected to ground and at least a second semiconductor diode connected in series between said first diode and said first capacitor for providing a first voltage proportional to the frequency of said asymmetrical signal; a parallel circuit connected between said first capacitor and said first means for supplying a selectable direct current to said first capactior, said parallel circuit comprising rectifying means connected to ground through the parallel combination of a second capacitor and a potentiometer, said potentiometer having a variable arm connected to said first capacitor; and a feedback amplifier operative from said first voltage for producing an output signal proportional to the frequency of said oscillatory input signal.

7. An electrical circuit comprising: first means operative from an oscillatory input signal for producing an asymmetrical signal having a small negative portion; a first semiconductor diode; capacitive means connected between said first means and said first diode for receiving said asymmetrical signal, said first diode being biased above the knee of its current-voltage characteristic when said input signal is substantially zero for providing a low impedance charge path to said capacitive means; charge transferral means including a first capacitor connected to ground and second and third semiconductor diodes connected in series between said first diode and said first capacitor for providing a first voltage proportional to the frequency of said asymmetrical signal; a parallel circuit connected between said first capacitor and said first means for supplying a selectable direct current to said first capacitor, said parallel circuit comprising rectifying means connected to ground through the parallel combination of a second capacitor and a potentiometer, said potentiometer having a variable arm connected to said first capacitor; and a direct current integrating amplifier operative from said first voltage for producing an output signal proportional to the frequency of said oscillatory input signal and supplying a portion of said output signal back to said first capacitor effective to maintain a net zero charge on said first capacitor.

8. A frequency diode-rate counter circuit comprising: a first zener diode operative from an oscillatory input signal for producing an asymmetrical signal having a predetermined positive amplitude and a small negative amplitude; a second semiconductor diode; a first capacitor connected between said first and second diodes; means for biasing said second diode slightly above the knee of its current-voltage characteristic when said input signal is substantially zero for providing a low impedance charge path to said first capacitor at all times; a second capacitor connected to ground; third and fourth semiconductor diodes connected in series and between said first and second capacitors, said third and fourth diodes presenting a high impedance in both directions when said input signal is substantially zero but a low impedance from said first capacitor to said second capacitor when said input signal is greater than zero; parallel circuit means connected between said second capacitor and said first diode for supplying a selectable direct current to said second capacitor; and a direct current integrating amplifier connected to said second capacitor for producing an output signal proportional to the frequency of said input signal and supplying a portion of said output signal back to said second capacitor effective to maintain a net zero charge on said second capacitor.

References Cited in the file of this patent

UNITED STATES PATENTS

| | | |
|---|---|---|
| 2,526,353 | Harralson | Oct. 17, 1950 |
| 2,832,070 | Bateman | Apr. 22, 1958 |
| 2,848,610 | Freienmuth | Aug. 19, 1958 |